(12) United States Patent
Koo

(10) Patent No.: US 8,470,667 B2
(45) Date of Patent: Jun. 25, 2013

(54) SEMICONDUCTOR DEVICE INCLUDING RESERVOIR CAPACITOR AND METHOD OF MANUFACTURING THE SAME

(75) Inventor: Dong Chul Koo, Seongnam (KR)

(73) Assignee: Hynix Semiconductor Inc, Icheon-Si (KR)

( * ) Notice: Subject to any disclaimer, the term of this patent is extended or adjusted under 35 U.S.C. 154(b) by 287 days.

(21) Appl. No.: 12/839,279

(22) Filed: Jul. 19, 2010

(65) Prior Publication Data
US 2011/0193150 A1     Aug. 11, 2011

(30) Foreign Application Priority Data

Feb. 5, 2010   (KR) .................. 10-2010-0010932

(51) Int. Cl.
*H01L 21/8242*     (2006.01)

(52) U.S. Cl.
USPC ............. 438/239; 438/250; 438/393; 257/68; 257/E21.008; 257/E29.343

(58) Field of Classification Search
USPC .... 438/210, 238, 239, 250, 393, 243; 257/71, 257/296, 535, E27.088, E29.345, E21.008, 257/E21.351, E21.396, E21.648, 906, 68, 257/532, 301, E27.034, E27.016, E29.343
See application file for complete search history.

(56) References Cited

U.S. PATENT DOCUMENTS

| | | | | |
|---|---|---|---|---|
| 5,796,135 A * | 8/1998 | Liang et al. | ................. | 257/296 |
| 6,313,003 B1 * | 11/2001 | Chen | .................. | 438/396 |
| 6,384,444 B2 * | 5/2002 | Sakoh | .................. | 257/303 |
| 6,410,397 B1 * | 6/2002 | Ochiai et al. | .................. | 438/381 |
| 7,067,869 B2 * | 6/2006 | Cheng et al. | ................. | 257/301 |
| 7,633,138 B2 * | 12/2009 | Takewaki et al. | ............. | 257/535 |
| 2003/0087491 A1 * | 5/2003 | Jeong | .................. | 438/244 |
| 2004/0212041 A1 * | 10/2004 | Takamatsu et al. | ........... | 257/534 |
| 2007/0066011 A1 * | 3/2007 | Sinha | .................. | 438/243 |
| 2008/0076192 A1 * | 3/2008 | Hidaka et al. | ................... | 438/3 |
| 2008/0135910 A1 * | 6/2008 | Youn | .................. | 257/311 |
| 2008/0191252 A1 * | 8/2008 | Nakamura et al. | ........... | 257/295 |
| 2009/0065837 A1 * | 3/2009 | Lee et al. | .................. | 257/296 |
| 2009/0236908 A1 * | 9/2009 | Park | .................. | 307/19 |
| 2012/0100689 A1 * | 4/2012 | Engelhardt et al. | ........... | 438/396 |

FOREIGN PATENT DOCUMENTS

| | | | |
|---|---|---|---|
| CN | 1905345 A | * | 1/2007 |
| JP | 2010-087517 A | | 4/2010 |
| KR | 100564422 B1 | | 3/2006 |
| KR | 1020080089789 A | | 10/2008 |
| KR | 1020080098177 A | | 11/2008 |

* cited by examiner

*Primary Examiner* — Matthew Landau
*Assistant Examiner* — Joseph C Nicely

(57) ABSTRACT

A method of manufacturing a semiconductor memory device includes forming a first capacitor using a metal oxide semiconductor (MOS) transistor, forming a second capacitor being a pillar type corresponding to a cell capacitor formed in a cell region, and forming a third capacitor over the first and the second capacitors.

12 Claims, 9 Drawing Sheets

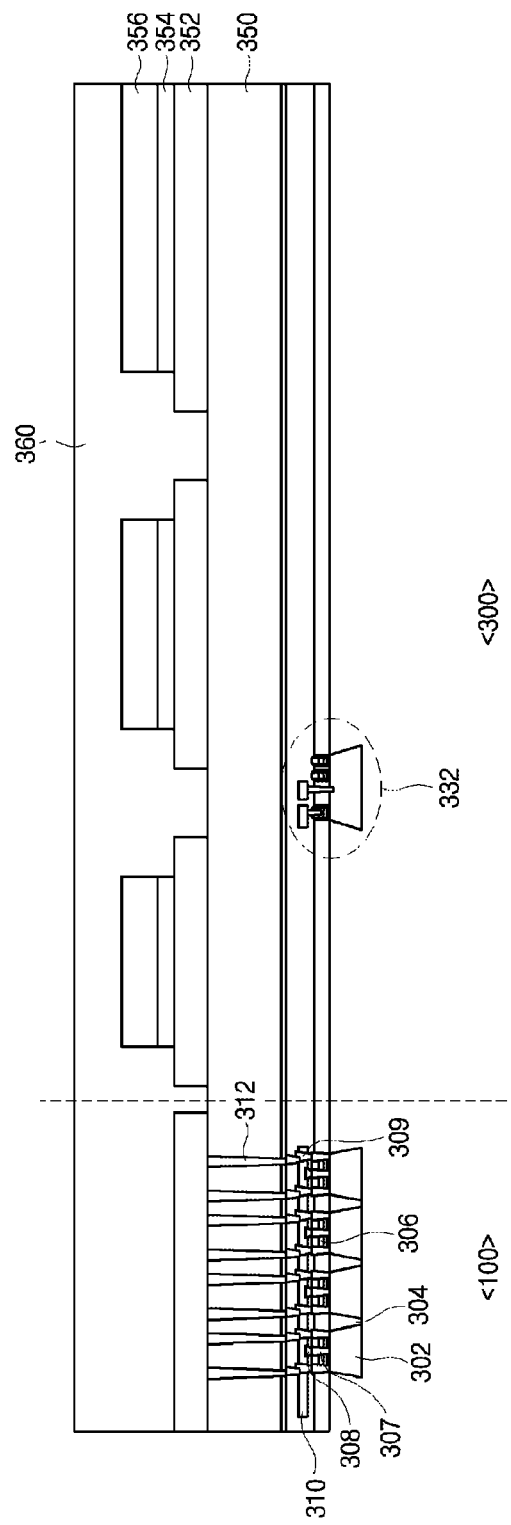

SEMICONDUCTOR DEVICE INCLUDING RESERVOIR CAPACITOR AND METHOD OF MANUFACTURING THE SAME

CROSS-REFERENCES TO RELATED APPLICATION

The priority of Korean patent application No. 10-2010-0010932 filed on Feb. 5, 2010, the disclosure of which is hereby incorporated in its entirety by reference, is claimed.

BACKGROUND OF THE INVENTION

The present invention relates to a semiconductor device including a reservoir capacitor and a method of manufacturing the same, and more particularly, to a semiconductor device capable of substantially preventing a capacity of a reservoir capacitor from being reduced and a method of manufacturing the same.

A semiconductor memory device includes a cell region including a plurality of unit cells and a peripheral region including components which control a data transmission and a power supply, etc. The cell region includes the plurality of unit cells each of which comprised of a capacitor and a transistor. The capacitor is used to temporality store data, and the transistor is used to transfer data between the capacitor and a bit line in response to a control signal input through a word line by using a semiconductor property which the conductivity thereof varies according to a circumstance. The peripheral region includes input/output pads and data input/output lines for transferring data and an internal voltage circuit for supplying various voltages to internal circuits of the semiconductor memory device.

The semiconductor memory device includes reservoir capacitors in the peripheral region besides the capacitors comprising of the unit cells. Herein, the reservoir capacitor is included in the driving circuit of the peripheral region of the semiconductor memory device and stores electrons corresponding to voltages Vpp, Vblp, Vbb and Vint generated inside the semiconductor memory device to supply the stable power to the internal circuits of the semiconductor memory device. The reservoir capacitor may have large capacitance so as to supply a stable DC voltage.

The capacitance of a capacitor is proportional to a dimension of a capacitor electrode. That is, the larger the capacitor, the greater the capacitance. However, as an integration degree of the semiconductor memory device is increased, the dimension to be occupied by the capacitor is reduced. In particular, although the capacitor having a large capacitance is demanded in the cell region so as to store data for a long time, an area assigned to the cell capacitor is reduced much more, so that a capacitor having a 3-dimensional structure (e.g., a cylinder structure) is introduced to implement a capacitor having large capacitance in a small dimension. Meanwhile, the increase in integration degree in the peripheral region including the reservoir capacitor is lower than that in the cell region. Therefore, a capacitor having larger capacitance can be more readily fabricated in the peripheral region compared with in the cell region.

The reservoir capacitor included in the peripheral region of the conventional semiconductor memory device has been formed of a MOS capacitor of a planar type. This is because the area assigned to the capacitor is wide enough, and its fabrication process can be simplified by employing a MOS transistor formation process without adding processes required for fabricating the reservoir capacitor included in the peripheral region. Therefore, the source and drain regions of the MOS capacitor are electrically coupled to each other to perform the same function as the capacitor. Electrodes in the MOS capacitor are formed of a silicon layer of a semiconductor substrate and a polysilicon layer.

Recently, as a design rule is scaled down below 50 nm, the integration degree in the peripheral region of the semiconductor memory device gets higher. According to this, the dimension of the MOS capacitor occupying a large part of the peripheral region should be reduced. However, as the dimension of the MOS capacitor is decreased, the capacitance thereof is also reduced. Therefore, so as to form the reservoir capacitor having a large capacity while having a minute dimension, the reservoir capacitor having a structure similar to the cell capacitor formed in the cell region is fabricated in the peripheral region. In particular, a 3-dimensional structure used to form the cell capacitor in the cell region may be applied to the reservoir capacitor in the peripheral region, and thus the reservoir capacitor having capacitance about 17 to 18 times higher than that of the MOS capacitor can be fabricated in the same dimension of the peripheral region.

FIG. 1 is a sectional view illustrating a conventional semiconductor memory device.

Referring to FIG. 1, the semiconductor memory device is typically divided into a cell region 10, a core area 20, a peripheral region 30 and a fringe area 40. Hereinafter, respective areas will be described in more detail.

First, in the cell region 10, an isolation layer 104 for defining an active region 102 is formed in a semiconductor substrate and a plurality of gate patterns 106 are formed on the active region 102. Landing plugs 107 are formed between the gate patterns 106, and a bit line contact 108 and a storage node contact 109 are formed on the landing plugs 107. The bit line contact 108 is connected to a bit line 110. A lower electrode 112 of a cell capacitor is formed to be connected to the storage node contact 109 formed over the active region 102, wherein the lower electrode 112 is of a pillar type and disposed over the bit line 110. An upper electrode 114 of the cell capacitor is formed over the lower electrode 112, and a dielectric layer (not shown) of the cell capacitor is formed between the lower and upper electrodes 112 and 114. A plurality of metal wires 120 and 122 and a plurality of contacts 116 and 118 are formed over the capacitor.

The core area 20 includes a sense amplifier and a switch which are comprised of a plurality of transistors formed on the active region 102 like in the cell region 10. The core area 20 does not include a capacitor for storing data, but includes a transistor and contacts 116 and 118 for connecting a plurality of metal wires 120 and 122 which are formed at the same height as in the cell region 10.

The peripheral region 30 includes a pad 134 for inputting/outputting data and signals, and various wires. In addition, the peripheral region 30 includes reservoir capacitors 130 and 132 for a stable operation. The reservoir capacitors 130 and 132 includes the second reservoir capacitor 130 having an electrode of a pillar type like the capacitor formed in the cell region 10 and the first reservoir capacitor 132 which uses a MOS transistor formed in the active region as a capacitor, wherein the MOS transistor is of a planar type. The peripheral region 30 further includes a fuse 136 and a guard ring 138.

A plurality of elements are very densely disposed in the cell region 10, but there are many empty spaces between several elements in the peripheral region 30 compared with the cell region 10. Among elements formed in the peripheral region 30, the reservoir capacitors 130 and 132 occupy a relatively large area and dimension. The area occupied by the reservoir capacitors 130 and 132 is about 10% of the total chip area of the semiconductor memory device.

As an integration degree of semiconductor memory devices get higher, an area assigned to reservoir capacitors gets smaller. If the minimal size of the plurality of elements and the minimal space between the elements included in the semiconductor memory device is maintained, to overcome the limit of a fabrication margin and enhance the operation stability, the area where the reservoir capacitors are to be formed may be inevitably diminished.

If an area assigned to the reservoir capacitor is sufficient, a semiconductor memory device may use a MOS transistor as a reservoir capacitor. However, as the integration degree of the semiconductor memory device become higher, it is difficult to ensure the capacitance of the reservoir capacitor by using the MOS transistor. Therefore, the reservoir capacitor is formed to have a structure similar to that of the cell capacitor so that the capacitance can be ensured even in a narrow area. Recently, as the integration degree of the semiconductor memory device gets much higher, the area assigned to the reservoir capacitor is further diminished. Thereafter, it is very difficult to ensure the capacitance of the reservoir capacitor and the operation stability of the semiconductor memory device. Therefore, a new technique for fabricating a reservoir capacitor is needed to prevent the capacitance of the reservoir capacitor from being reduced although the integration degree of the semiconductor memory device becomes higher.

SUMMARY

Embodiments of the present invention is to provide a method of manufacturing a semiconductor device, capable of fabricating a reservoir capacitor including a capacitor using a MOS transistor, a capacitor having a pillar type like a cell transistor and a capacitor formed in an empty space in vertical and horizontal directions in a peripheral region.

According to one aspect of an exemplary embodiment, A method of manufacturing a semiconductor memory device, the method comprising: forming a first capacitor using a metal oxide semiconductor (MOS) transistor; forming a second capacitor being a pillar type corresponding to a cell capacitor formed in a cell region; and forming a third capacitor over the first and the second capacitors.

The third capacitor is disposed between a metal wire and an upper electrode of the cell capacitor.

The upper electrode of the second capacitor and a lower electrode of the third capacitor are formed at substantially the same height with respect to a semiconductor substrate.

The first, the second, the third capacitors are reservoir capacitors formed in a peripheral region.

The third capacitor is a planar type capacitor including a lower electrode, a dielectric layer and an upper electrode each having a planar shape, wherein a planar surface area of the lower electrode of the third capacitor is greater than that of the upper electrode of the third capacitor.

The first, the second and the third capacitors are connected in parallel to each other.

The first, the second and the third capacitor are connected in series in a high voltage region.

Each of the first, the second and the third capacitors includes a dielectric layer of oxide/nitride/oxide (ONO) or $ZrO_2/Al_2O_3/ZrO_2$ (ZAZ).

The second capacitor comprises an electrode which includes any one of Ti, Ta and W, and the third capacitor comprises an electrode which includes polysilicon and has a thickness of about 50 Å to about 1000 Å.

According to another aspect of another exemplary embodiment, A semiconductor memory device, comprising: a cell capacitor disposed in a cell region, the cell capacitor being a pillar type; and a first reservoir capacitor defined using a MOS transistor; a second reservoir capacitor being a pillar type corresponding to the cell capacitor; and a third reservoir capacitor disposed in a peripheral region at a height between a metal wiring and an upper electrode of the cell capacitor.

An upper electrode of the second reservoir capacitor and a lower electrode of the third reservoir capacitor are formed at substantially the same height with respect to a semiconductor substrate.

The first, the second, and the third reservoir capacitors are connected in parallel to each other.

The first, the second and the third reservoir capacitors are included in the peripheral region.

Each of the first, the second and the third reservoir capacitors includes a dielectric layer of ONO or ZAZ.

The second reservoir capacitor comprises an electrode including any one of Ti, Ta and W, and the third reservoir capacitor comprises an electrode including polysilicon and having a thickness of about 50 Å to about 1000 Å.

The first, the second and the third reservoir capacitors are connected in series in a high voltage region.

The third reservoir capacitor is of a planar type and has a lower electrode whose planar surface area is greater than that of an upper electrode of the third reservoir capacitor.

a space distance between the third reservoir capacitor and a data line is larger than a space distance between the third reservoir capacitor and a bias line.

These and other features, aspects, and embodiments are described below in the section entitled "DESCRIPTION OF EXEMPLARY EMBODIMENT".

BRIEF DESCRIPTION OF THE DRAWINGS

The above and other aspects, features and other advantages of the subject matter of the present disclosure will be more clearly understood from the following detailed description taken in conjunction with the accompanying drawings, in which:

FIGS. 3A through 3G are sectional views illustrating a method of manufacturing a semiconductor memory device according to an embodiment of the present invention.

DESCRIPTION OF EMBODIMENTS

Figure 1:
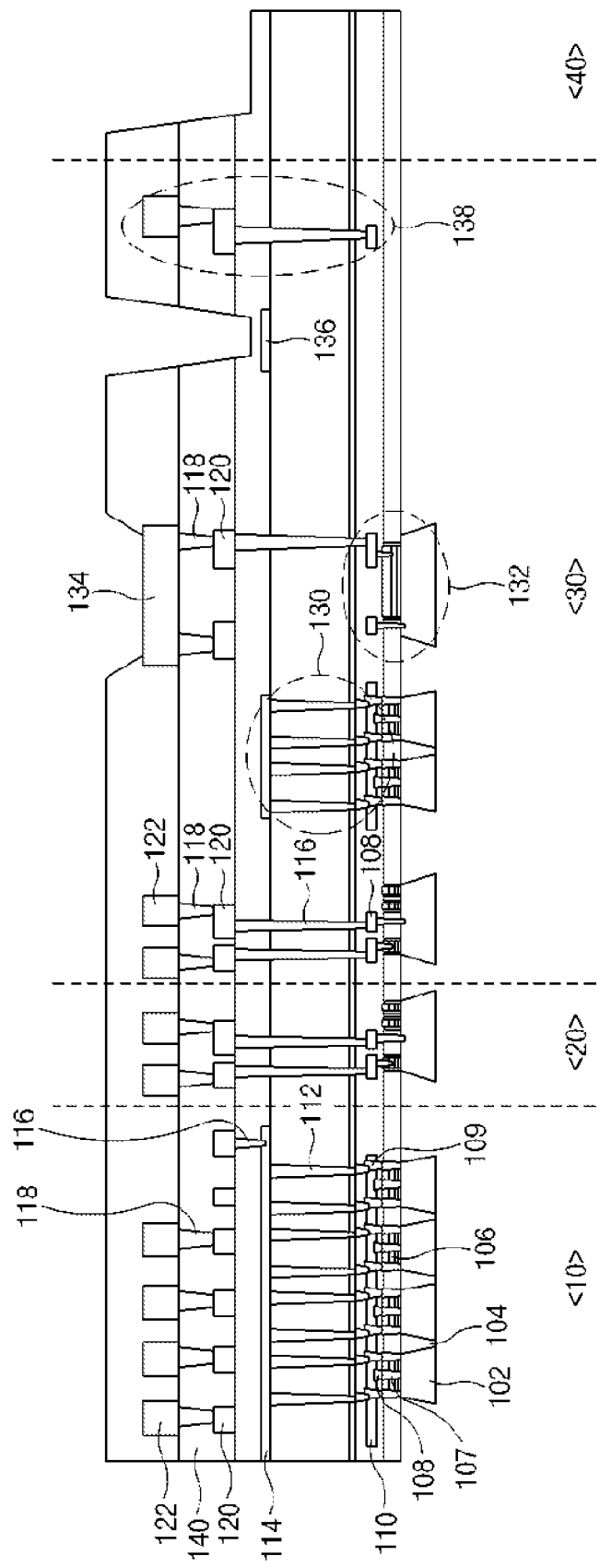
FIG. 1 is a sectional view illustrating a conventional semiconductor memory device.

Embodiments of the present invention are described herein with reference to cross-sectional illustrations that are schematic illustrations of the embodiments (and intermediate structures). As such, variations from the shapes of the illustrations as a result, for example, of manufacturing techniques and/or tolerances, are to be expected. Thus, the embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

In accordance with embodiments of the present invention, a capacitor is formed in an empty space of a peripheral region in order for a reservoir capacitor to have a large capacitance although an integration degree of a semiconductor memory device is increased. The conventional semiconductor memory device includes a reservoir capacitor formed by using a MOS transistor or a reservoir capacitor having the same type as a cell capacitor at the same height. However, according to the embodiments of the present invention, a reservoir capacitor is formed between metal wires disposed above the reservoir capacitor in the conventional semiconductor device shown in FIG. 1. Hereinafter, the embodiments of the present invention will be described in detail with reference to the accompanying drawings.

Figure 2:
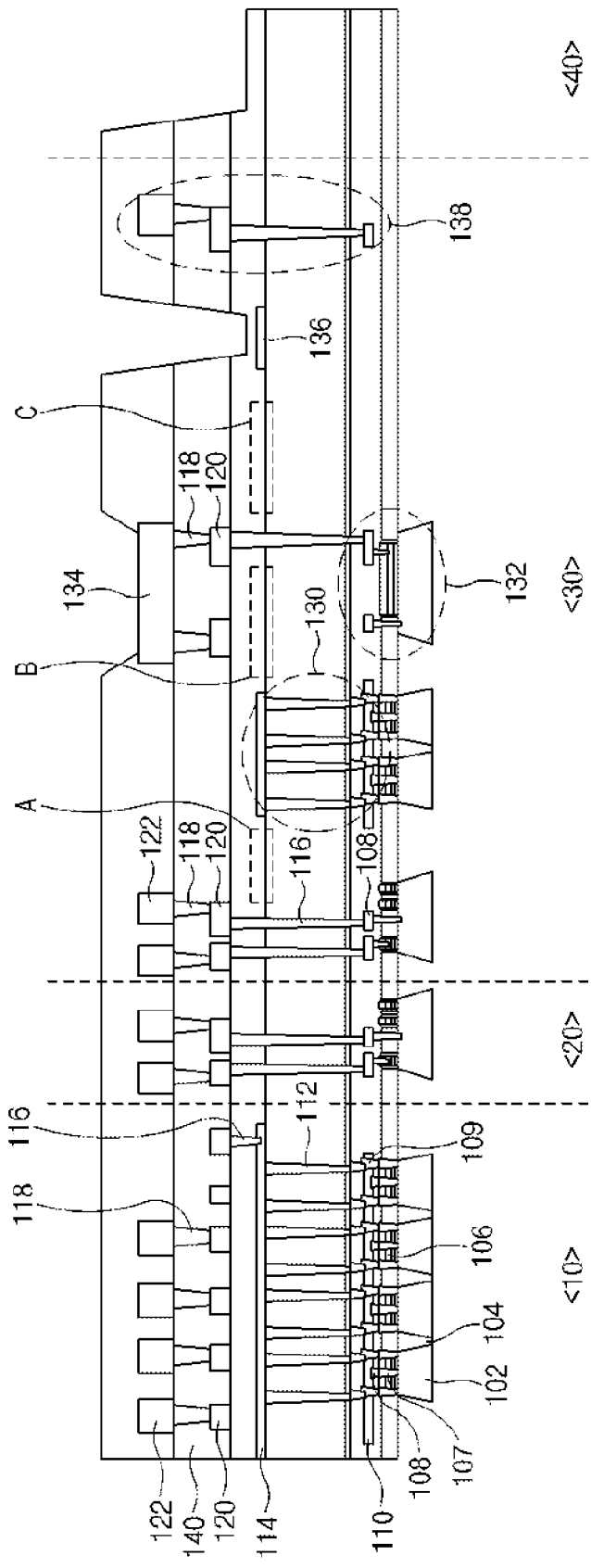
FIG. 2 is a sectional view illustrating an improved method of manufacturing a reservoir capacitor in a semiconductor memory device.

FIG. 2 is a sectional view illustrating an improved method of manufacturing a reservoir capacitor in a semiconductor memory device.

Referring to FIG. 2, the semiconductor memory device is divided into a cell region 10, a core area 20, a peripheral region 30 and a fringe area 40. Compared with the cell region 10 and the core area 20, the density of the elements is lower in the peripheral area 30 where reservoir capacitors 130 and 132 are included. As illustrated in FIG. 2, other elements are not formed over and around the reservoir capacitors 130 and 132, and only plural interlayer insulating layers are deposited over the reservoir capacitors 130 and 132. In particular, any element is not formed in a space A around and over an upper electrode of the second reservoir capacitor 130, a space B between a pad 134 and the first reservoir capacitor 132 and a space C between the pad 134 and a fuse 136.

Therefore, this embodiment of the present invention uses a plate layer which is an upper electrode of a cell capacitor as a lower electrode of a reservoir capacitor and forms a dielectric layer and an upper electrode of the reservoir capacitor on the plate layer 114 so as to fabricate reservoir capacitors in the spaces A, B and C.

FIGS. 3A to 3G are sectional views illustrating a method of manufacturing a semiconductor memory device according to an embodiment of the present invention. A cell region 100 and a peripheral region 300 in the semiconductor memory device are described in FIGS. 3A to 3G, and the description of a core area and a fringe area will be omitted herein. Furthermore, the description of a method of fabricating elements such as a pad, a fuse and a guard ring included in the peripheral region 300 which are not directly related to the present invention will be omitted.

Figure 3A:
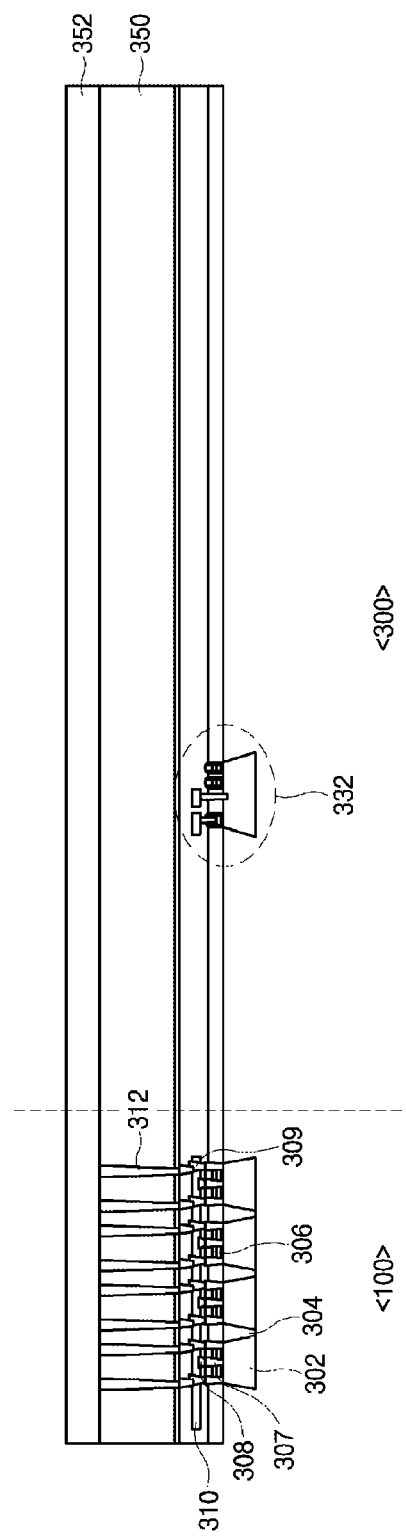

Referring to FIG. 3A, an isolation layer 304 for defining an active region 302 is formed in a semiconductor substrate in the cell region 100 and the peripheral region 300. A plurality of gate patterns 306 are formed on the active regions 302. A landing plug contact 307 is formed on the active region 302 disposed between the gate patterns 306 in the cell region 100. A bit line contact 308 and a storage node contact 309 are formed on the landing plug contact 307 in the cell region 100, and a bit line contact 308 is formed on the active region 302 disposed between the gate patterns 306 in the peripheral region 300.

A bit line 310 is formed on the bit line contact 308 disposed in the cell region 100 and a lower electrode 312 of a cell capacitor is formed on the storage node contact 309 and disposed over the bit line 310, wherein the lower electrode 312 is of a pillar type. Herein, the pillar type lower electrode 312 is formed on a bottom and sidewalls of a contact hole (not shown) and comprised of a metal material such as Ti, Ta or W. A plate layer 352 which used for an upper electrode of the cell capacitor is formed on the lower electrode 312, and a dielectric layer (not shown) of the capacitor is formed between the lower electrodes 312 and the plate layer 352. Since the structure and fabrication method of the cell capacitor are similar to those of the conventional pillar type capacitor, a more detailed description thereof will be omitted herein.

Meanwhile, when the bit line contact 308, the lower electrode 312 and the dielectric layer are formed in the cell area 100, a first interlayer insulating layer 350 is deposited in the peripheral area 300. Next, the plate layer 352 which is used for the upper electrode of the cell capacitor included in the cell area 100 is deposited on the cell area 100 and the peripheral area 300. Herein, the plate layer 352 is formed with a thickness of 50 Å to 1000 Å.

Figure 3B:
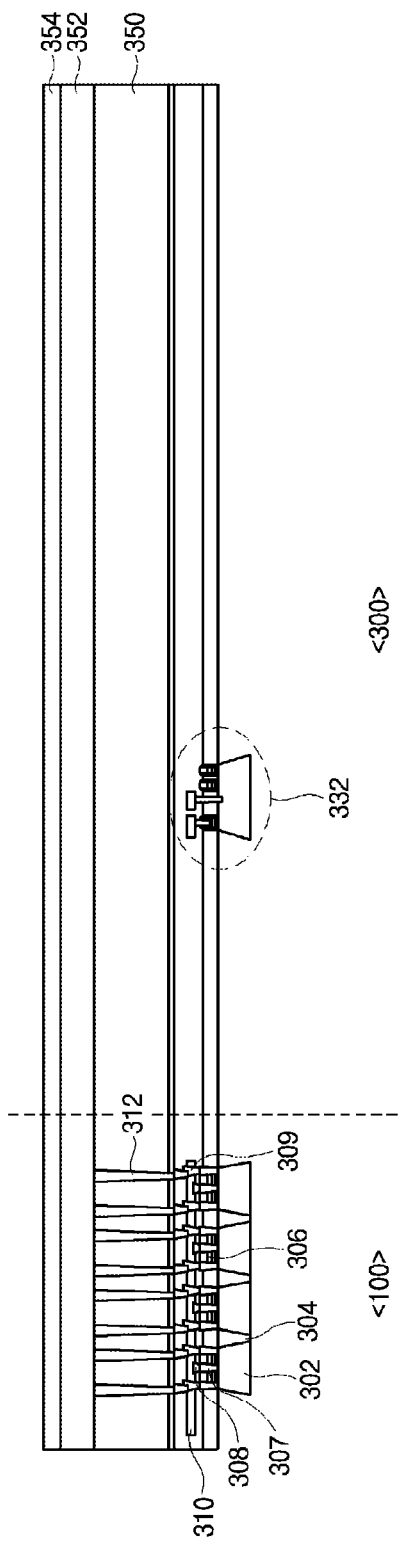

Referring to FIG. 3B, a dielectric layer 354 is formed on the plate layer 352. At this time, the dielectric layer 354 may include a structure of oxide/nitride/oxide (ONO) or ZrO2/Al2O3/ZrO2 (ZAZ).

Figure 3C:
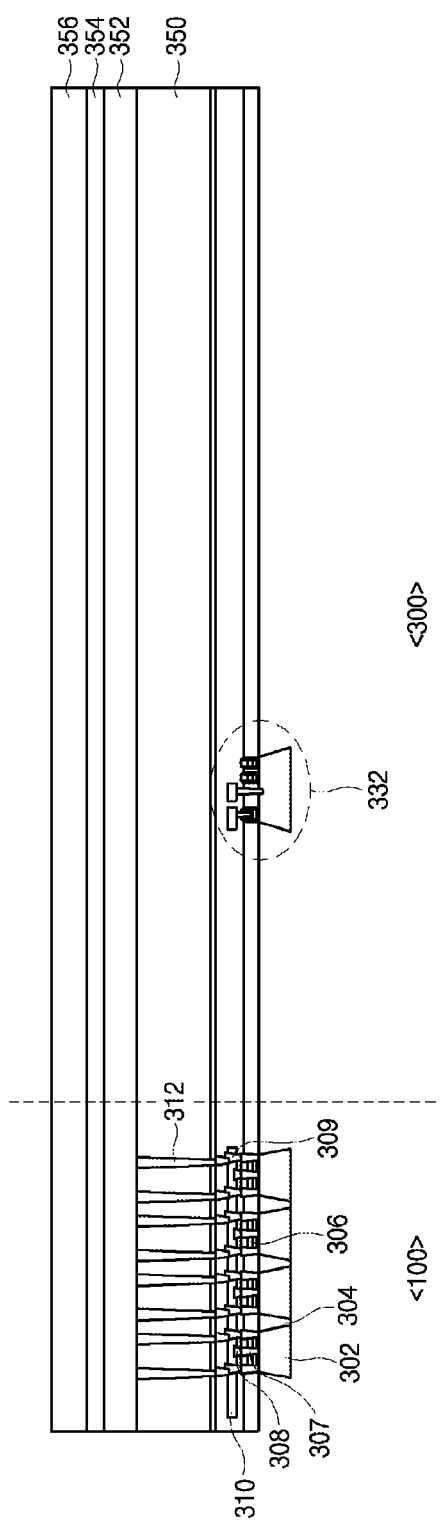

Referring to FIG. 3C, a conduction layer 356 is formed on the dielectric layer 354. The conduction layer 356 may include a polysilicon layer.

Differently from the prior art, in the embodiment of the present invention, the dielectric layer 354 and the conduction layer 356 are formed on the plate layer 352. At this time, the plate layer 352 is used for the upper electrode of the cell capacitor included in the cell region 100 as well as a lower electrode of a reservoir capacitor to be formed in the peripheral region 300. Also, the conduction layer 356 is used for an upper electrode of the reservoir capacitor.

Figure 3D:
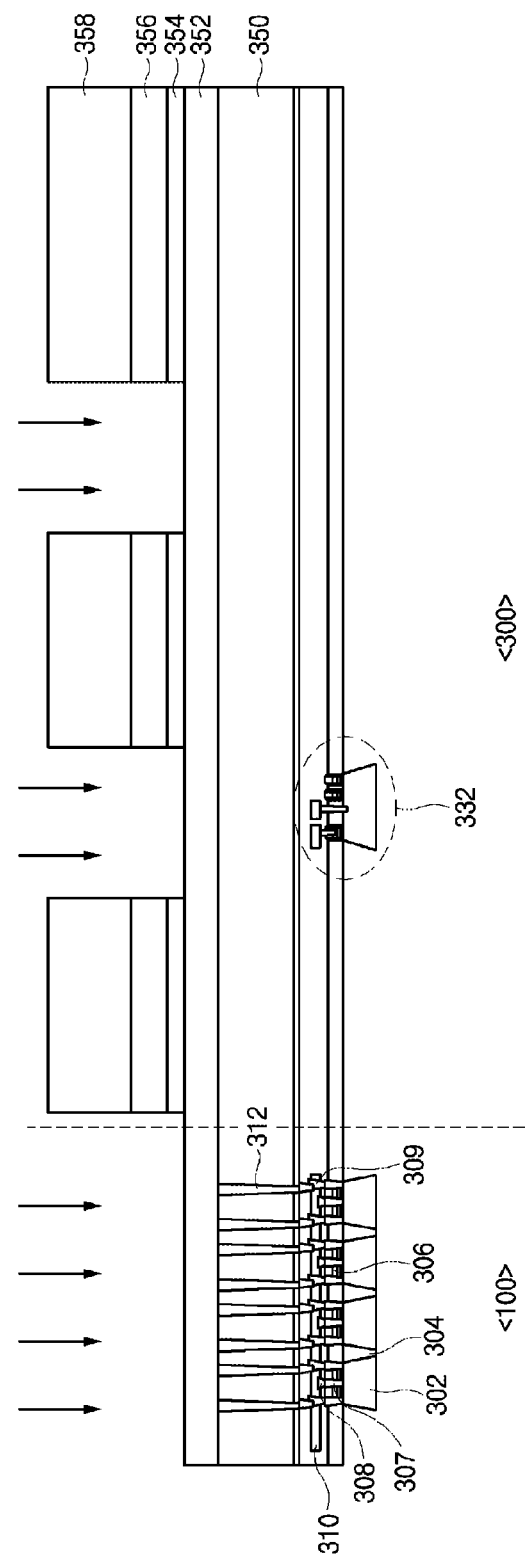

Referring to FIG. 3D, a photoresist pattern 358 is formed on the conduction layer 356, and then the conduction layer 356 and the dielectric layer 354 are partially etched until the plate layer 352 is exposed using the photoresist pattern 358 as an etch mask. Then, the photoresist pattern 358 is removed.

Figure 3E:
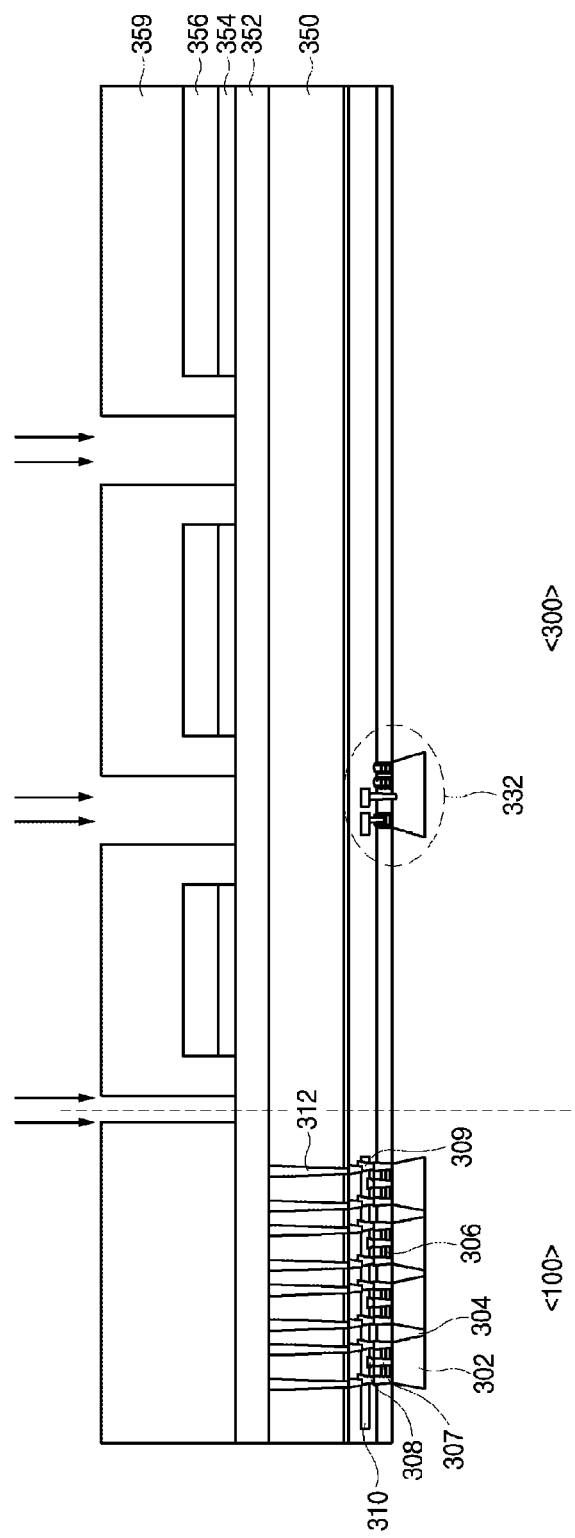

Referring to FIG. 3E, an insulating layer 359 is formed to cover exposed portions of the plate layer 352 and the conduction layer 356. Next, the insulating layer 359 is patterned by using a mask which defines the upper electrode of the cell capacitor included in the cell region 100 and the lower electrode of the reservoir capacitor included in the peripheral region 300. The exposed portions of the plate layer 352 are etched by using the patterned insulating layer 359 as an etch mask. At this time, the plate layer 352 in the peripheral region 300 is patterned to have a wider dimension than the conduction layer 356.

Referring to FIG. 3F, the patterned insulating layer 359 is removed, and a second interlayer insulating layer 360 is formed to cover the plate layer 352 and the conduction layer 356.

Figure 3G:
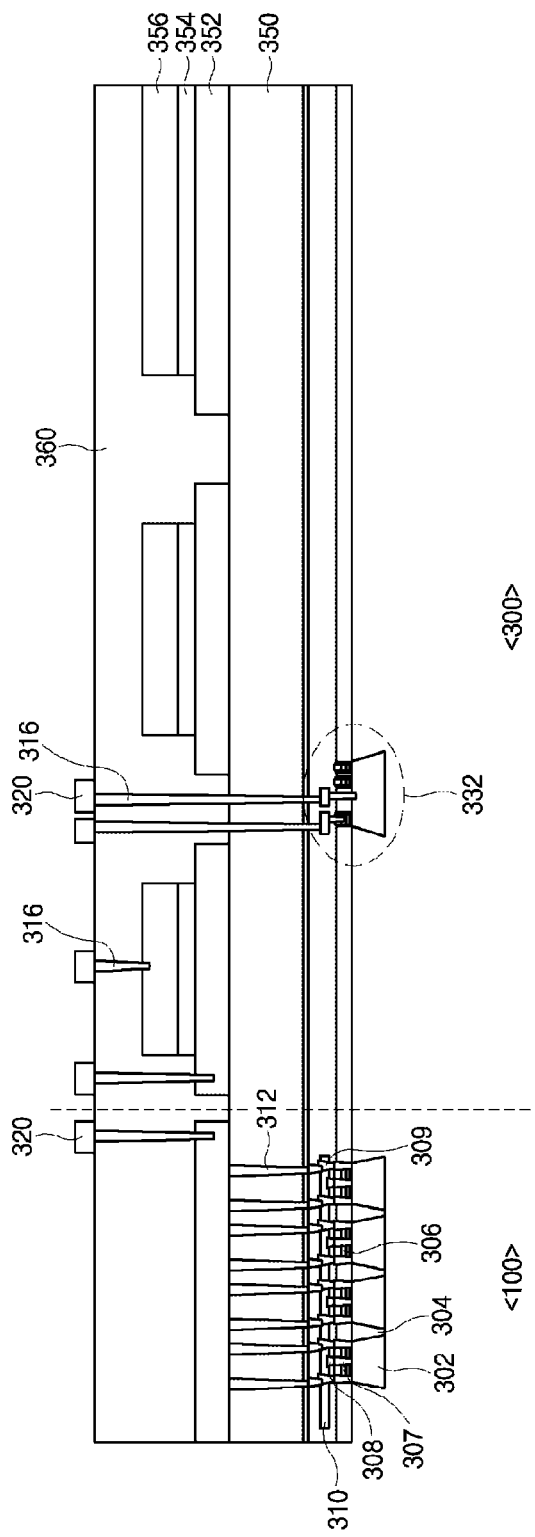

Referring to FIG. 3G, the second interlayer insulating 360 is partially etched to form contact holes (not shown), and a conductive material is buried within the contact holes to form contacts 316. Next, metal wires 320 are formed on the contacts 316. At this time, in the reservoir capacitor, the metal wire 320 may be connected to the plate layer 352 formed below the conduction layer 356 due to a dimension difference between the plate layer 352 and the conduction layer 356.

As described above, the reservoir capacitors which have different types from the prior reservoir capacitor are formed in empty spaces of the peripheral region 300 in the semiconductor memory device in this embodiment. In particular, the reservoir capacitors including the plate layer 352 as the lower electrode may be formed in the space A around and over the upper electrode of the second reservoir capacitor 130, the space B between the pad 134 and the first reservoir capacitor 132 and the space C between the pad 134 and the fuse 136 in the semiconductor memory device as described in FIG. 2

Although not shown, the reservoir capacitors according to the embodiment are formed in the empty spaces of the semiconductor memory device so that they are formed with the prior reservoir capacitor such as a micro capacitor of a pillar type or a MOS capacitor using a MOS transistor. If these various type capacitors are connected in parallel to each other, the capacitance of the reservoir capacitor included in the peripheral region of the highly integrated semiconductor memory device can be increased to improve the operation stability and yield of the semiconductor memory device. Furthermore, if the reservoir capacitor is connected to a bias pad or a bias line to which a high voltage VPP is applied, some of the various kinds of capacitors may be connected in series to prevent the generation of a defect, thereby improving the reliability.

In the embodiment of the present invention, if the reservoir capacitor is disposed near by the metal wire, the interference may occur between the metal wire and the reservoir capacitor due to a small distance there between. Accordingly, the reservoir capacitor may be formed to be spaced at a constant distance from the data line for transmitting data within the peripheral region 300. In the meantime, the interference with the bias line supplying the voltage is less effective compared with the interference with the data line, so that a distance between the bias line and the reservoir capacitor may be smaller than the distance between the data line and the reservoir capacitor.

The embodiments of the present invention form the reservoir capacitors in empty spaces which are not utilized in the peripheral region. Therefore, although the integration degree of the semiconductor memory device increases, the embodiments can prevent the capacitance of the reservoir capacitor included in the peripheral region from being reduced. Furthermore, the embodiments of the present invention can form a capacitor having large capacitance in a peripheral region of a highly integrated semiconductor memory device to enhance the operation stability and the yield.

While certain embodiments have been described above, it will be understood that the embodiments described are by way of example only. Accordingly, the devices and methods described herein should not be limited based on the described embodiments. Rather, the systems and methods described herein should only be limited in light of the claims that follow when taken in conjunction with the above description and accompanying drawings.

What is claimed is:

1. A method of manufacturing a semiconductor memory device, the method comprising:
    forming a first capacitor using a metal oxide semiconductor (MOS) transistor in a peripheral region;
    forming a second capacitor in a cell region; and
    forming a third capacitor in the peripheral region,
    wherein an entire lower electrode of the third capacitor and an entire upper electrode of the second capacitor are formed at substantially the same height with respect to a semiconductor substrate.

2. The method of claim 1, wherein the third capacitor is a planar type capacitor including the lower electrode, a dielectric layer, and an upper electrode each having a planar shape, and
    wherein a planar surface area of the lower electrode of the third capacitor is greater than that of the upper electrode of the third capacitor.

3. The method of claim 1, wherein each of the first, the second and the third capacitors includes a dielectric layer of oxide/nitride/oxide (ONO) or ZrO2/Al2O3/ZrO2 (ZAZ).

4. The method of claim 1, wherein the second capacitor comprises an electrode which includes any one of Ti, Ta and W.

5. The method of claim 1, wherein the third capacitor comprises an electrode which includes polysilicon and has a thickness of about 50 Å to about 1000 Å.

6. The method of claim 1 wherein the lower electrode of the third capacitor and the upper electrode of the second capacitor are simultaneously formed.

7. A semiconductor memory device, comprising:
    a cell capacitor disposed in a cell region, the cell capacitor being a pillar type;
    a first reservoir capacitor defined using a MOS transistor and disposed in a peripheral region; and
    a second reservoir capacitor disposed in the peripheral region,
    wherein an entire lower electrode of the third capacitor and an entire upper electrode of the cell capacitor are formed at substantially the same height with respect to a semiconductor substrate.

8. The semiconductor memory device of claim 7, wherein each of the first and second reservoir capacitors includes a dielectric layer of oxide/nitride/oxide (ONO) or ZrO2/Al2O3/ZrO2 (ZAZ).

9. The semiconductor memory device of claim 7, wherein the cell capacitor comprises an electrode including any one of Ti, Ta and W.

10. The semiconductor memory device of claim 7, wherein the second reservoir capacitor comprises an electrode which includes polysilicon and has a thickness of about 50 Å to about 1000 Å.

11. The semiconductor memory device of claim 7, wherein the second reservoir capacitor is of a planar type and has a lower electrode whose planar surface area is greater than that of an upper electrode of the second reservoir capacitor.

12. The semiconductor memory device of claim 7, wherein the lower electrode of the second reservoir capacitor and the upper electrode of the cell capacitor are simultaneously formed.

* * * * *